(12) United States Patent
Jeong et al.

(10) Patent No.: US 7,914,693 B2
(45) Date of Patent: Mar. 29, 2011

(54) STAMP FOR MICRO/NANO IMPRINT LITHOGRAPHY USING DIAMOND-LIKE CARBON AND METHOD OF FABRICATING THE SAME

(75) Inventors: Jun-Ho Jeong, Daejeon (KR); Young-Suk Sim, Seoul (KR); Ki-Don Kim, Seoul (KR); Dae-Geun Choi, Daejeon (KR); Eung-Sug Lee, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 1168 days.

(21) Appl. No.: 11/582,461

(22) Filed: Oct. 18, 2006

(65) Prior Publication Data

US 2007/0158872 A1 Jul. 12, 2007

(30) Foreign Application Priority Data

Oct. 18, 2005 (KR) ........................ 10-2005-0098080

(51) Int. Cl.
*B44C 1/22* (2006.01)
(52) U.S. Cl. .............. 216/81; 216/58; 216/80; 438/725; 438/740
(58) Field of Classification Search .............. 216/58, 216/80, 81; 438/706, 725, 740
See application file for complete search history.

(56) References Cited

U.S. PATENT DOCUMENTS

| | | | |
|---|---|---|---|
| 6,858,909 B2 * | 2/2005 | Cyrille et al. ................. | 257/414 |
| 7,186,574 B2 * | 3/2007 | Dulay et al. .................... | 438/14 |
| 2002/0068377 A1 * | 6/2002 | Oku et al. ...................... | 438/105 |
| 2002/0098285 A1 * | 7/2002 | Hakovirta et al. .......... | 427/249.7 |
| 2004/0131963 A1 | 7/2004 | Ohta et al. | |
| 2005/0084804 A1 | 4/2005 | Truskett et al. | |
| 2005/0170292 A1 | 8/2005 | Tsai et al. | |

FOREIGN PATENT DOCUMENTS

| | | |
|---|---|---|
| JP | 03019154 | 1/1991 |
| JP | 05169459 | 7/1993 |
| JP | 10096808 | 4/1998 |
| JP | 2004130775 | 4/2004 |
| JP | 2004-164689 | 6/2004 |
| JP | 2004311713 | 11/2004 |
| JP | 2005047080 | 2/2005 |
| JP | 2005-193390 | 7/2005 |
| JP | 2006032423 | 2/2006 |
| KR | 10-2004-065752 A | 7/2004 |
| WO | WO 01/40537 A1 | 6/2001 |

OTHER PUBLICATIONS

Vasilets, V. N., "Characterization of doped diamond-like carbon films deposited by hot wire plasma sputtering of graphite", Applied Science, vol. A79, No. 8, Dec. 2004, pp. 2079-2084.
Zhu, W., "Novel co-sputtered fluorinated amorphous carbon films for sub-0.25 μm low κ damascene multilevel interconnect applications", Electron Devices Meeting, 1998. IEDM '98 Technological Digest International, Dec. 6, 1998, pp. 845-848.
Search report from EP 06021860.9-1226, Jun. 11, 2007.

* cited by examiner

*Primary Examiner* — Lan Vinh
(74) *Attorney, Agent, or Firm* — Pearl Cohen Zedek Latzer, LLP

(57) ABSTRACT

The present invention relates to a micro/nano imprint lithography technique and in particular, to a stamp that is used in an UV-micro/nano imprint lithography process or thermal micro/nano imprint lithography process and a method for fabricating the stamp.
The method for fabricating a stamp for micro/nano imprint lithography of the present invention includes i) depositing a thin film of diamond-like carbon on a substrate, ii) applying resist on the diamond-like carbon thin film, iii) patterning the resist, iv) etching the diamond-like carbon thin film by using the resist as a protective layer, and v) removing the resist.

10 Claims, 6 Drawing Sheets

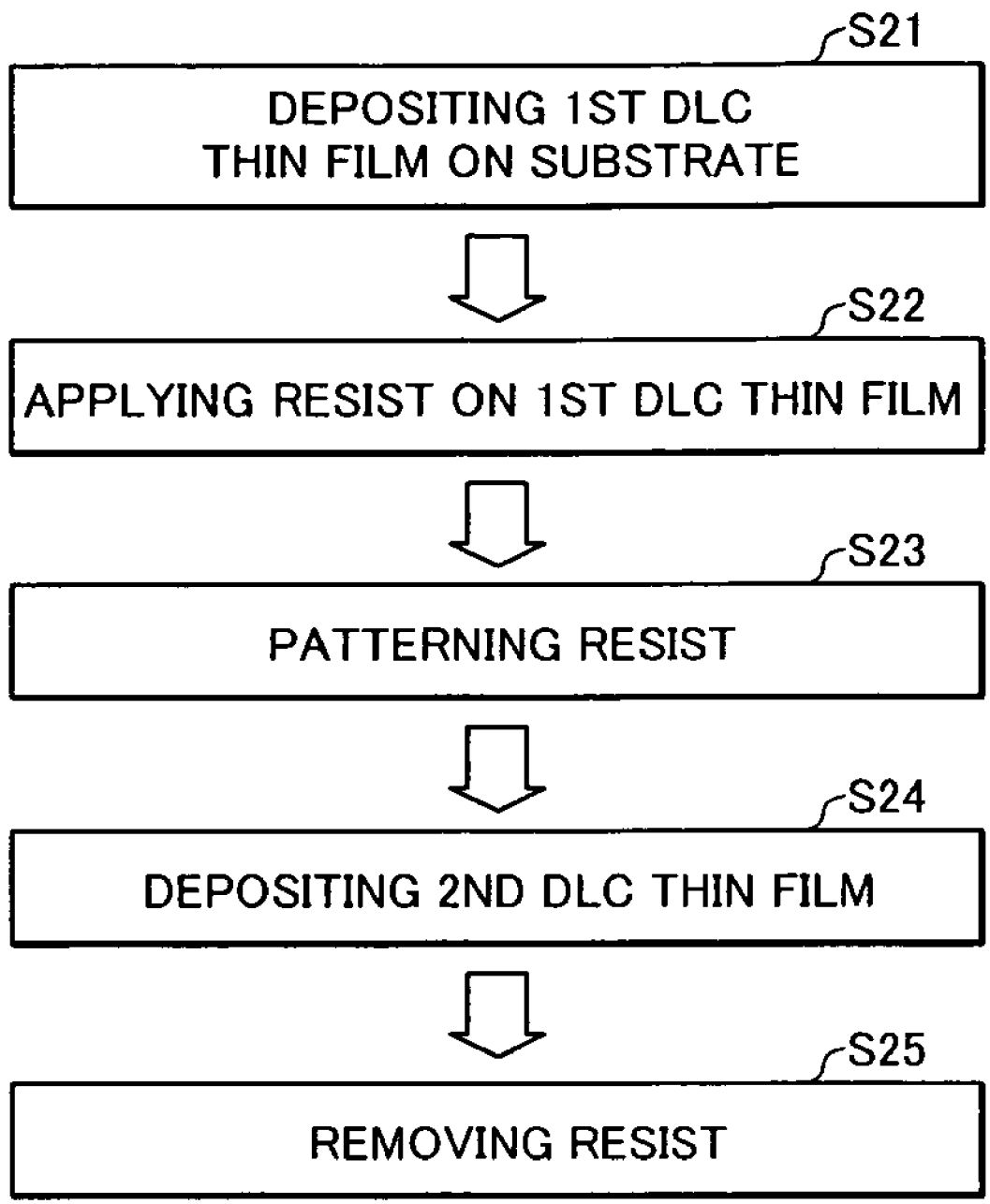

STAMP FOR MICRO/NANO IMPRINT LITHOGRAPHY USING DIAMOND-LIKE CARBON AND METHOD OF FABRICATING THE SAME

CROSS-REFERENCE TO RELATED APPLICATIONS

The present application claims priority to Korean patent application No. 10-2005-0098080 filed in the Korean Intellectual Property Office on Oct. 18, 2005, and all the benefits accruing therefrom under 35 U.S.C. §119, the contents of which are herein incorporated by reference in their entirety.

BACKGROUND OF THE INVENTION (a) Field of the Invention

The present invention relates to a micro/nano imprint lithography technique and in particular, to a stamp that is used in an UV-micro/nanoimprint lithography process or thermal micro/nano imprint lithography process and a method for fabricating the stamp.

(b) Description of the Related Art

Micro/nano imprint lithography is a technique to fabricate micro/nano-structures effectively and economically and uses a stamp with embossed micro/nano-structure thereon in a manner that the stamp is pressed on the surface of resist applied on a substrate for imprinting the micro/nano-structure repeatedly.

Professor Chou suggested the previous microimprint lithography technique in which a stamp with embossed structures in microscale is fabricated first by electron-beam lithography, followed by being contacted with the surface of a resist made of polymethylmethacrylate (PMMA) applied on a substrate, and the stamp is pressed in high temperature and separated off from the substrate after cool-down.

In the method aforementioned, a reversed structure to the structure embossed on the stamp is imprinted on the resist of the substrate, and the residual resist in the pressed area is removed by anisotropic etching.

Another imprint lithography technique is Laser-Assisted Direct Imprint (LADI) in which the imprint is carried out by a single 20 ns excimer laser with a wavelength of 308 nm making a resist coated on a silicon wafer (substrate) melted down instantly.

Another imprint lithography technique is Nanosecond laser-assisted nanoimprint lithography (LA-NIL) in which a polymer material is used as a resist, and micro-structures with 100 nm in line-width and 90 nm in depth may be imprinted thereon.

All of the imprint techniques aforementioned use heat to cure the resist.

However, such an imprint technique using heat has difficulty in multiple alignment due to the thermal deformation of the resist when applied for semiconductor fabrication where a multi-layer process is essential. Also, pressure as high as about 30 atms applied to the stamp for imprinting the high viscous resist may cause the break down of the structure made of a heat curable material. Furthermore, the opaqueness of the material used for the stamp substrate causes difficulty in multi-alignment during the process for fabricating the micro-structures.

Step & Flash Imprint Lithography (SFIL), proposed by professor Sreenivasan et al., is a technique to solve the problems of such a thermal imprint technique.

The SFIL technique features an ultraviolet (UV) ray-curable material for the resist that enables the fabrication of micro/nano-structures in room temperature and low pressure. It also features an UV ray-transparent material for the stamp substrate such as quartz and Pyrex glass.

In the SFIL processes, a transfer layer is firstly coated on a silicon substrate. Then UV ray-curable resin with low viscosity flows in so as to fill the micro-structure of the stamp by surface-tension while the UV ray-transparent stamp is kept from the transfer layer with a predetermined gap. At the time the filling completes, the stamp gets contacted with the transfer layer, and UV-ray is applied in order to cure the resin. Then the stamp is separated, and a micro-structure is imprinted finally on the substrate though etching and lift-off processes.

Recent studies are carried out on the way to press by the stamp the UV ray-curable resin drop placed between the transfer layer and the stamp in the SFIL process.

Another feature of the SFIL process is the adoption of multiple imprinting by a small unit-sized stamp instead of one imprinting on the entire substrate in a step and repeat way.

Though this method is efficient to fill the micro-structure due to the small stamping area, it is a shortcoming to take a long time for a substrate with a large base area to be imprinted because each stamping should go through its alignment and imprint.

On the other hand, the stamp for the previous microimprint lithography has an anti-sticking layer formed on the stamping surface thereof to prevent the stamp from being stuck with the resist.

However, in the case that the anti-sticking layer is formed on top of the micro/nano-structure smaller in dimension than 50 nm, the anti-sticking layer may distort the shape of the pattern embossed on the surface by the thickness of the anti-sticking layer so that the unwanted pattern may be obtained. Also, the structural stability of the anti-sticking layer may be deteriorated when the thickness thereof is reduced.

SUMMARY OF THE INVENTION

The present invention provides a stamp for micro/nano imprint lithography, the stamp including a diamond-like carbon thin film that is hydrophobic and light-transmittable.

Also, the present invention provides a method for fabricating a stamp for micro/nano imprint lithography, the method in which a diamond-like carbon thin film is deposited on the substrate to form a micro/nano-structure.

According to an embodiment of the present invention, the method for fabricating a stamp for micro/nano imprint lithography includes i) depositing a thin film of diamond-like carbon on a substrate, ii) applying resist on the diamond-like carbon thin film, iii) patterning the resist, iv) etching the diamond-like carbon thin film by using the resist as a protective layer, and v) removing the resist.

The substrate may be made of a light-transmittable material that may be one of, for example, quartz, glass, diamond, a transparent polymer and a transparent semiconductor such as indium tin oxide (ITO). The substrate for thermal imprint may be made of one of an opaque wafer, a semiconductor compound, a polymer, a ceramic material and materials above-mentioned.

In depositing the diamond-like carbon thin film, the deposition may be carried out by a process selected from ion plating, plasma chemical vapor deposition (CVD) using direct current (DC) or radio frequency (RF), sputtering using DC, RF or ion-beam, and laser synthesis.

Also, in depositing the diamond-like carbon thin film, a gas containing a fluoro group (F) may be poured or the diamond-like carbon thin film is deposited on the sputtered solid substrate containing a fluoro group (F) so as to make the diamond-like carbon thin film include the fluoro group (F). At least one of octafluorocyclobutane ($C_4F_8$), hexafluoroethane ($C_2F_6$), tetrafluoromethane ($CF_4$), trifluoromethane ($CHF_3$), sulfur hexafluoride ($SF_6$) may be poured as the gas including a fluoro group (F), and fluorocarbon resins may be used as the solid substrate.

The diamond-like carbon thin film may be etched by plasma etching process including reactive ion etching (RIE).

According to another embodiment of the present invention, the method for fabricating a stamp for micro/nano imprint lithography includes i) depositing a first thin film of diamond-like carbon on a substrate, ii) applying resist on the first diamond-like carbon thin film, iii) patterning the resist, iv) depositing a second diamond-like carbon thin film on top of the patterned resist and on the first diamond-like carbon thin film exposed through openings of the patterned resist, and v) removing the resist.

In deposit the first diamond-like carbon thin film or the second diamond-like carbon thin film, a gas containing a fluoro group (F) may be poured or the first diamond-like carbon thin film is deposited on the sputtered solid substrate containing a fluoro group (F) so as to make the first diamond-like carbon thin film or the second diamond-like carbon thin film include the fluoro group (F).

In removing the resist, both of the resist and the second diamond-like carbon thin film deposited on the resist are removed together.

According to a further embodiment of the present invention, the method for fabricating a stamp for micro/nano imprint lithography includes i) depositing a first thin film of diamond-like carbon on a substrate, ii) forming micro/nano-structures on top of the first diamond-like carbon thin film, and iii) depositing a second diamond-like carbon thin film to encompass the micro/nano -structures.

The micro/nano-structures may be made of a resin material.

On the other hand, a stamp for micro/nano imprint lithography according to another embodiment of the present invention includes a substrate and a micro/nano-structure made of diamond-like carbon thin film on top of the substrate.

The micro/nano-structure made of diamond-like carbon thin film may include a fluoro group (F).

A first diamond-like carbon thin film is formed on the substrate, and the micro/nano-structure may be formed by a second diamond-like carbon thin film patterned on top of the first diamond-like carbon thin film.

Furthermore, the micro/nano-structure may be formed by coating the structure made of a resin material with diamond-like carbon thin film.

As explained hereinabove, according to the method for fabricating a stamp for micro/nano imprint lithography of the present invention, the stamp is fabricated by patterning the diamond -like carbon thin film deposited on the substrate, the diamond-like carbon thin film which is hydrophobic and light-transmittable, especially ultraviolet ray-transmittable so that the sticking may be prevented at imprinting between the resist and the stamp without an anti-sticking layer.

Also, the problems caused by the previous anti-sticking layer may be prevented so that a wanted pattern may be obtained and the process stability may be acquired.

In addition, the hydrophobic property may be improved by pouring a fluorine (F) gas at the deposition of the diamond-like carbon thin film or by sputtering the solid substrate containing a fluoro group (F) so as to include a fluoro group (F).

BRIEF DESCRIPTION OF THE DRAWINGS

FIG. 3 is a sequential diagram showing processes for fabricating a stamp for micro/nano imprint lithography according to a second embodiment of the present invention.

DETAILED DESCRIPTION OF THE EMBODIMENTS

Hereinafter, the embodiments of the present invention will be explained in detail by referring to the appended drawings.

Figure 1:
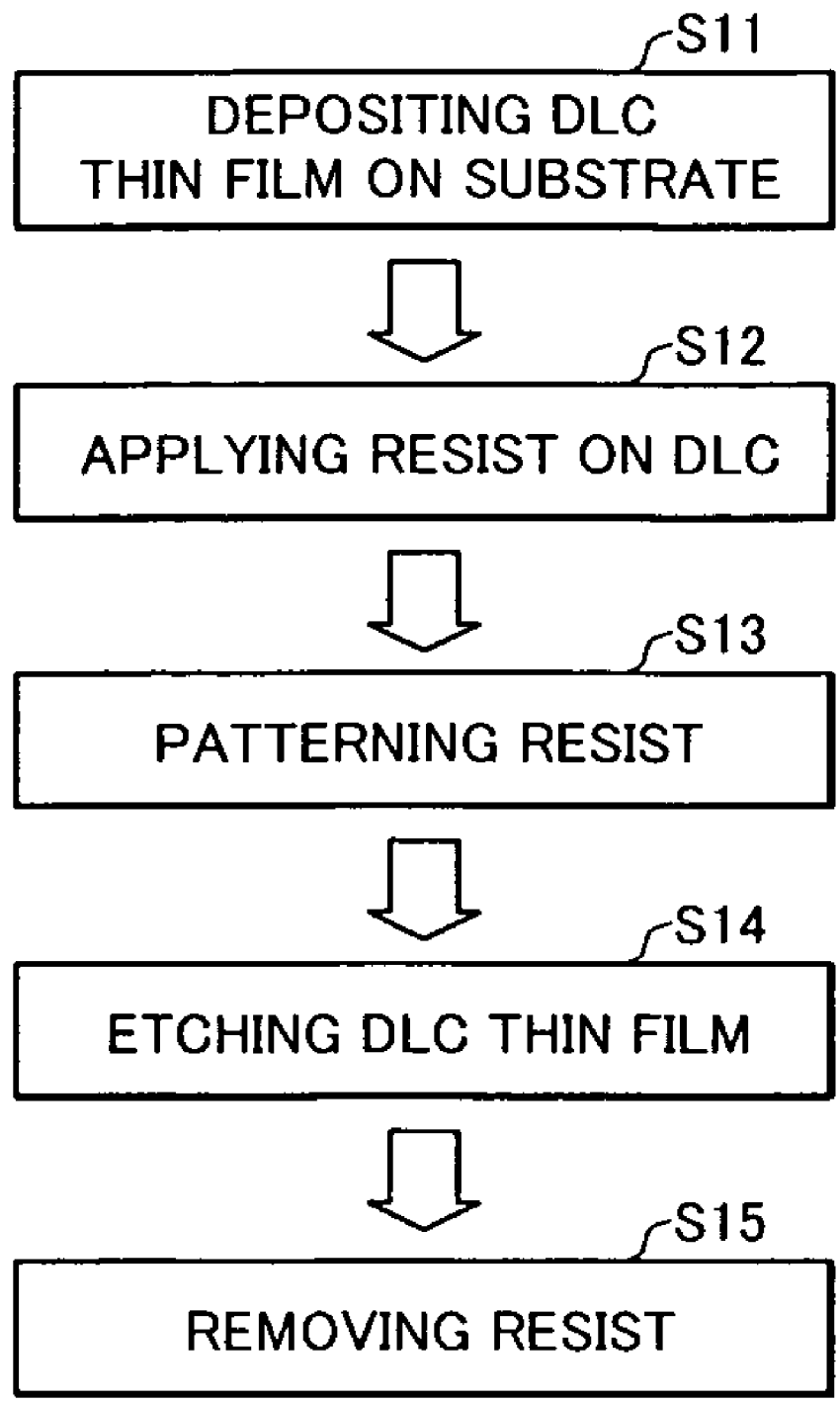
FIG. 1 is a sequential diagram showing processes for fabricating a stamp for micro/nano imprint lithography according to a first embodiment of the present invention.
Figure 2A:
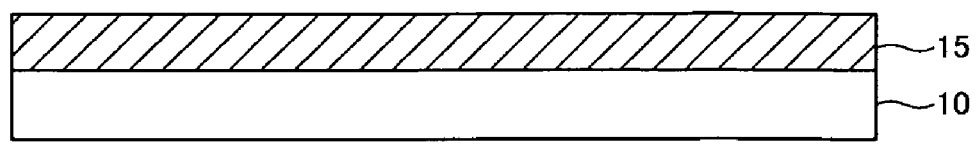
FIGS. 2A to 2D are process diagrams for fabricating a stamp for micro/nano imprint lithography according to the first embodiment of the present invention.
Figure 2B:
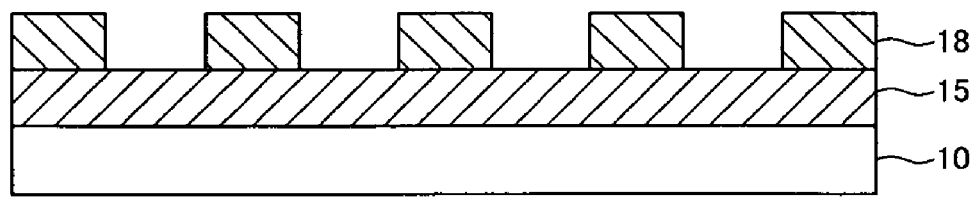
Figure 2C:
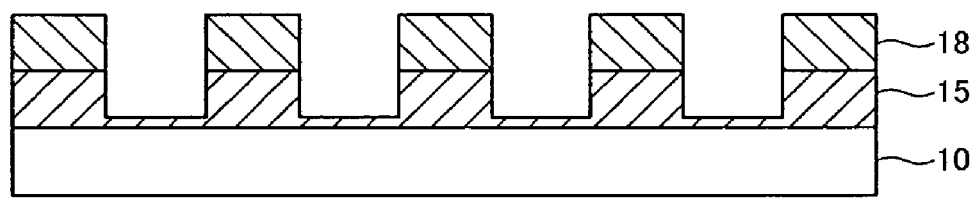
Figure 2D:
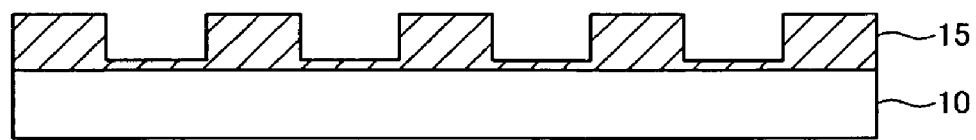
Figure 4A:
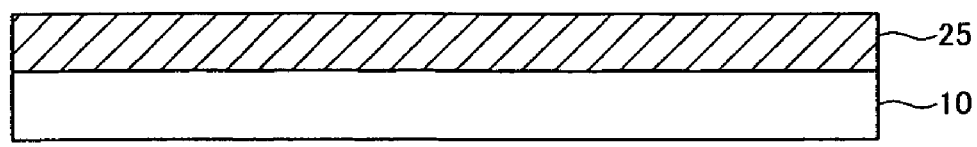
FIGS. 4A to 4D are process diagrams for fabricating a stamp for micro/nano imprint lithography according to the second embodiment of the present invention.
Figure 4B:
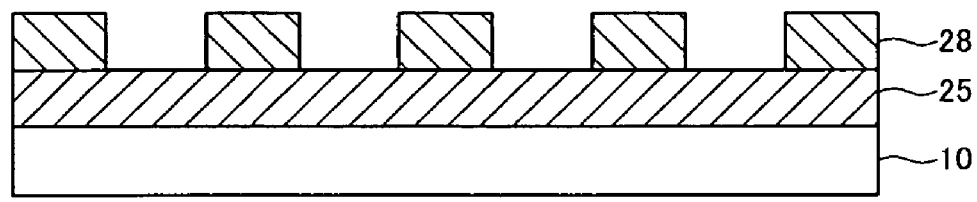
Figure 4C:
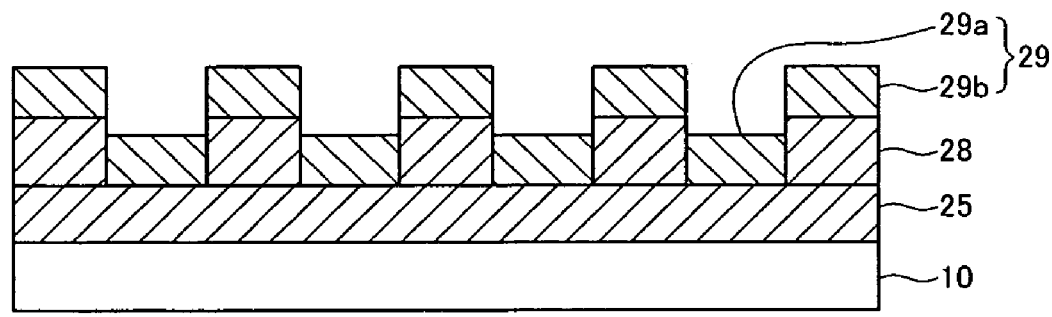
Figure 4D:
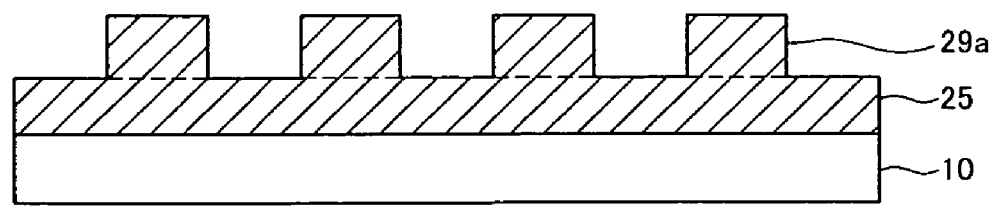

For fabricating a stamp according to a first embodiment of the present invention, as shown in FIGS. 1 and 2, a thin film 15 of diamond-like carbon (DLC) is firstly deposited on a substrate 10 (S11).

The deposition of the DLC thin film 15 may be carried out by a process selected from ion plating, plasma chemical vapor deposition (CVD) using direct current (DC) or radio frequency (RF), sputtering using DC, RF or ion-beam, and laser synthesis.

The substrate 10 may be made of a light-transmittable material that may be one of, for example, quartz, glass, diamond, a transparent polymer and a transparent semiconductor such as indium tin oxide (ITO). In an ultraviolet (UV) micro/nano imprint lithography process, in particular, the substrate 10 partly composing the stamp is preferably made of a light-transmittable material in order to transmit ultraviolet ray through the stamp. The substrate 10 for thermal imprint may be made of one of an opaque wafer, a semiconductor compound, a polymer, a ceramic material and materials above-mentioned.

The DLC film is one of non-crystalline solid-phase carbon films that are as excellent as diamond in hardness, wear resistance, lubrication, electrical insulation, chemical stability and optical property. The DLC film is good in hydrophobic property and is capable of light -transmittance, especially UV ray-transmittance.

The hardness of the DLC film varies widely according to the synthesizing condition and is on the whole as high as silicon carbide (SiC) or aluminum oxide ($Al_2O_3$).

The DLC film has a very low friction coefficient. The friction coefficient of the DLC film measured by a scratch tester using a diamond tip varies in the range of 0.04 to 0.06, which is lower by about 30% than that of glass. The friction coefficient between diamond and the film or the film and the film is not dependent on humidity. However, the friction coefficient between the steel ball and the film is strongly dependent on humidity. Also, the friction coefficient decreases to a value as low as 0.00 to 0.02 as humidity decreases.

The DLC film has so excellent in chemical stability that it does not react with the most of acid or organic solvent, and no damage is found on the coating even in 80% aqua regia.

The most eminent electrical property of the DLC film is a high resistivity. The resistivity is in the wide range of $10^4$ to $10^{14}$ ohms (K) according to the synthesizing condition.

On the other hand, a fluorine (F) gas may be added or a fluoro group (F) may be included by sputtering the solid substrate containing a fluoro group (F) in order to improve the hydrophobic property of the DLC thin film 15. When a gas including a fluoro group (F) such as octafluorocyclobutane ($C_4F_8$), hexafluoroethane ($C_2F_6$), tetrafluoromethane ($CF_4$), trifluoromethane ($CHF_3$), sulfur hexafluoride ($SF_6$) is properly supplied at the time of the deposition of DLC thin film 15, the fluoro group (F) is positioned tangled inside the DLC thin film 15. Also, fluorocarbon resins, for example Teflon polytetrafluoroethylene (PTFE) may be used as the solid substrate for a target.

Next, a resist 18 is applied on top of the DLC thin film 15 (S12). Photoresist may be used as the resist 18.

Then the resist 18 is patterned (S13). Electron-beam lithography or ion-beam lithography may be used for patterning the resist 18.

According to the electron-beam lithography process, first the electron-beam scans along a wanted pattern on the photoresist that shows chemical changes by the exposure to the electron -beam. Secondly, the patterning of the resist 18 is carried out through developing by removing or leaving the exposed area selectively.

According to the ion-beam lithography process, the resist 18 may be patterned by the ion-beam instead of the electron beam in a similar way to the electron-beam lithography process Next, the DLC thin film 15 is etched by using the patterned resist 18 as a protective layer (S14).

The plasma etching process including reactive ion etching (RIE) is used for etching the DLC thin film 15.

According to the reactive ion etching process, an etch-resistant etching mask is used, and an anisotropic etching is carried out by using a gas with high selectivity ratio.

First, plasma is formed in the area of the DLC thin film 15 to be removed, and electric potential formed outside starts sputtering. Discharge inside the plasma produces chemical reactant from a gas poured in. Selected as the etching gas may be a gas that is capable of producing a volatile by-product by reacting with the diamond-like carbon to be removed.

Next, the resist 18 is removed (S15).

The stamp for micro/nano imprint lithography of the present embodiment is finished by removing the resist 18 covering the patterned DLC thin film 15. Therefore, the micro/nano -structure of the stamp is made of the DLC thin film 15. The stamp made as above may be used for thermal micro/nano imprint lithography as well as UV micro/nano imprint lithography.

FIG. 3 is a sequential diagram showing processes for fabricating a stamp for micro/nano imprint lithography according to a second embodiment of the present invention, and FIGS. 4A to 4D are process diagrams for fabricating a stamp for micro/nano imprint lithography according to the second embodiment of the present invention.

For fabricating a stamp according to the present embodiment, a first thin film 25 of diamond-like carbon (DLC) is firstly deposited on a substrate 10 (S21).

The deposition of the DLC thin film 25 may be carried out by one process selected from ion plating, plasma chemical vapor deposition (CVD) using direct current (DC) or radio frequency (RF), sputtering using DC, RF or ion-beam, and laser synthesis.

The substrate 10 may be made of a light-transmittable material that may be one of, for example, quartz, glass, diamond, a transparent polymer and a transparent semiconductor such as indium tin oxide (ITO). In an ultraviolet (UV) micro/nano imprint lithography process, in particular, the substrate 10 partly composing the stamp is preferably made of a light-transmittable material in order to transmit ultraviolet ray through the stamp. The substrate 10 for thermal imprint may be made of one of an opaque wafer, a semiconductor compound, a polymer, a ceramic material and materials above-mentioned.

The first DLC thin film 25 may be a material having the same properties as the DLC thin film used in the first embodiment. In order to improve the hydrophobic property of the first DLC thin film 25, a fluorine (F) gas may be added or a fluoro group (F) may be included by sputtering the solid substrate containing a fluoro group (F).

Next, a resist 28 is applied on top of the first DLC thin film 25 (S22). Photoresist may be used as the resist 28.

Then the resist 28 is patterned (S23). Electron-beam lithography or ion-beam lithography may be used for patterning the resist 28.

Then, a second DLC thin film 29 is deposited on top of the patterned resist 28 and on the first DLC thin film 25 exposed through openings of the patterned resist 28 (S24).

In other words, the openings and the cover parts are formed by patterning the resist 28. The cover part of the resist 28 serves to cover and hide the first DLC thin film 25, and the opening of the resist 28 serves to expose the first DLC thin film 25. At the time of deposition of the second DLC thin film 29 over the patterned resist 28, the second DLC thin film 29 is deposited on top of the first DLC thin film 25 exposed through openings as well as on top of the cover parts of the resist 28.

In order to improve the hydrophobic property of the second DLC thin film 29, a fluorine (F) gas may be added or a fluoro group (F) may be included by sputtering the solid substrate containing a fluoro group (F).

Next, the resist 28 is removed (S25).

In the step to remove the resist 28, the second DLC thin film 29b deposited on the resist 28 is removed together. Therefore, only the second DLC thin film 29a deposited on the first DLC thin film 25 remains so as to form the micro/nano-structure after the resist 28 is removed. That is the finished stamp of the micro/nano imprint lithography of the present embodiment. The stamp made as above may be used for thermal micro/nano imprint lithography as well as UV micro/nano imprint lithography.

Figure 5:
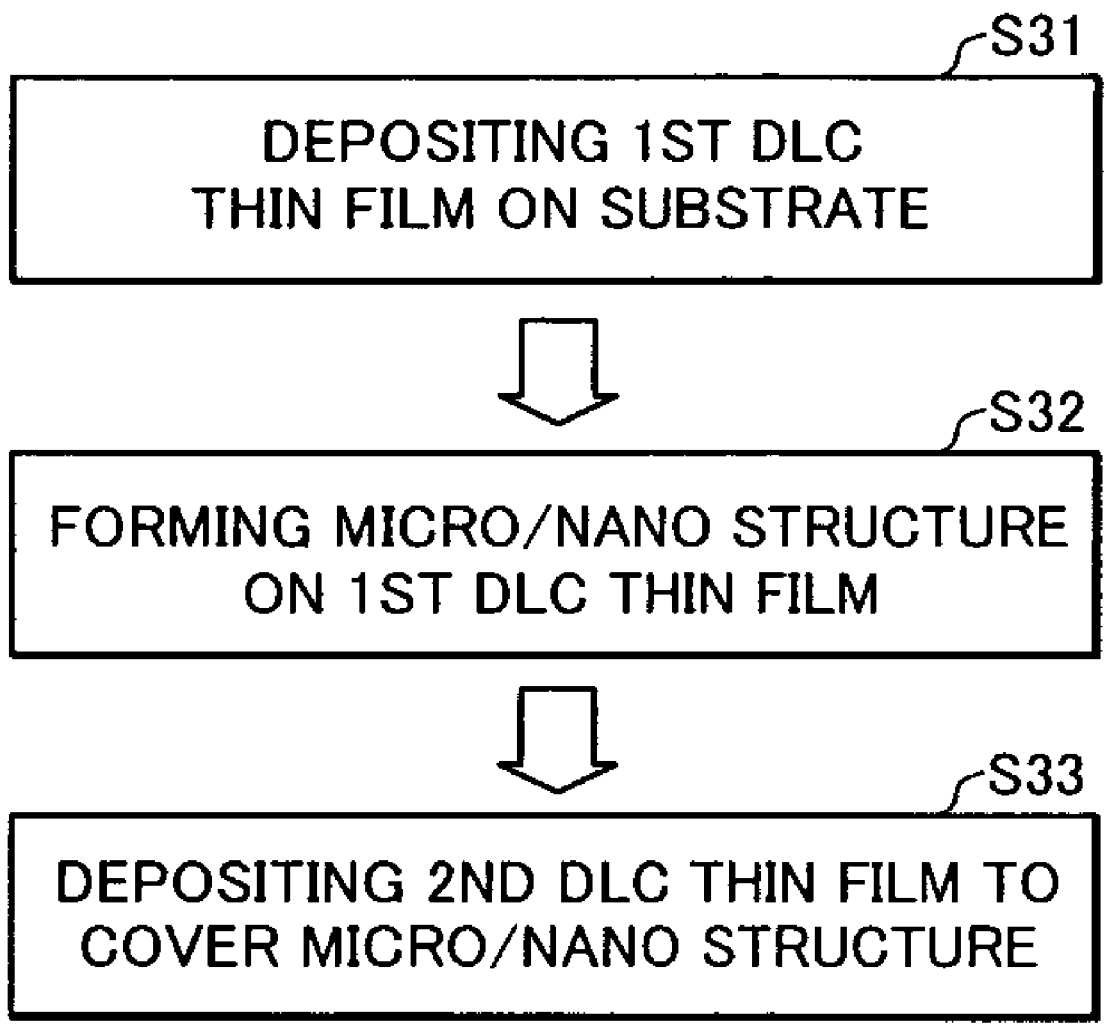
FIG. 5 is a sequential diagram showing processes for fabricating a stamp for micro/nano imprint lithography according to a third embodiment of the present invention.
Figure 6A:
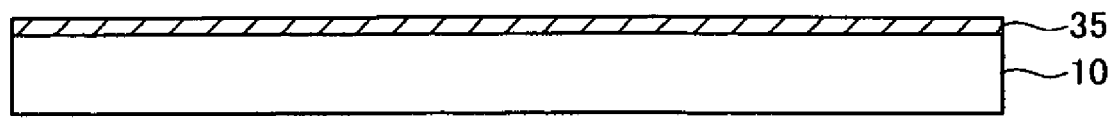
FIGS. 6A to 6C are process diagrams for fabricating a stamp for micro/nano imprint lithography according to the third embodiment of the present invention.
Figure 6B:
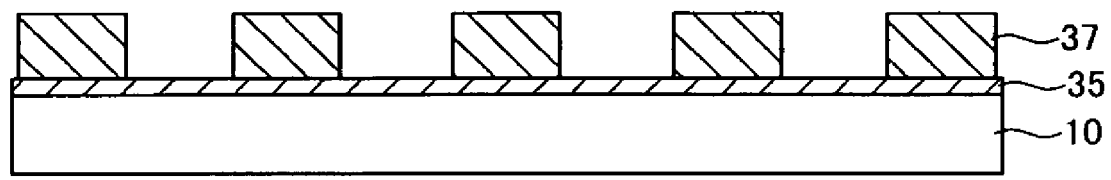
Figure 6C:
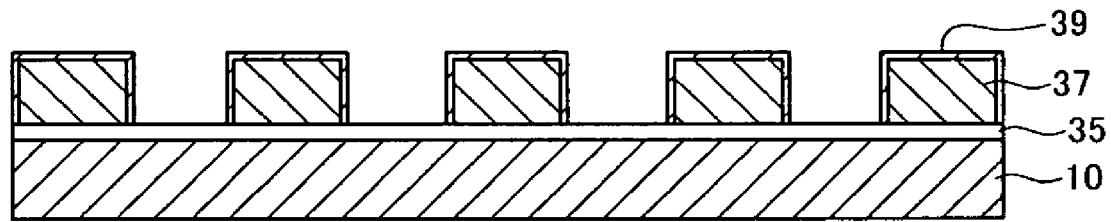

FIG. 5 is a sequential diagram showing processes for fabricating a stamp for micro/nano imprint lithography according to a third embodiment of the present invention, and FIGS. 6A to 6C are process diagrams for fabricating a stamp for micro/nano imprint lithography according to the third embodiment of the present invention.

For fabricating a stamp according to the present embodiment, a first thin film 35 of diamond-like carbon (DLC) is firstly deposited on a substrate 10 (S31).

The deposition of the DLC thin film 35 may be carried out by one process selected from ion plating, plasma chemical vapor deposition (CVD) using direct current (DC) or radio frequency (RF), sputtering using DC, RF or ion-beam, and laser synthesis.

The substrate 10 may be made of a light-transmittable material that may be one of, for example, quartz, glass, diamond, a transparent polymer and a transparent semiconductor such as indium tin oxide (ITO). In an ultraviolet (UV) micro/nano imprint lithography process, in particular, the substrate 10 partly composing the stamp is preferably made of a light-transmittable material in order to transmit ultraviolet ray through the stamp. The substrate 10 for thermal imprint may be made of one of an opaque wafer, a semiconductor compound, a polymer, a ceramic material and materials above-mentioned.

The first DLC thin film 35 may be a material having the same properties as the DLC thin film used in the first embodiment. In order to improve the hydrophobic property of the first DLC thin film 35, a fluorine (F) gas may be added or a fluoro group (F) may be included by sputtering the solid substrate containing a fluoro group (F).

Next, micro/nano-structures 37 are formed on the first DLC thin film 35 (S32). The micro/nano-structures 37 may be made of a resin material.

Then, a second DLC thin film 39 is deposited to encompass the micro/nano-structures 37 (S33).

In this process, a fluorine (F) gas may be added or a fluoro group (F) may be included by sputtering the solid substrate containing a fluoro group (F) in order to improve the hydrophobic property of the second DLC thin film 39, The stamp for micro/nano imprint lithography of the present embodiment is finished by coating the micro/nano-structures 37 with the second DLC thin film 39. The stamp made as above may be applied for thermal micro/nano imprint lithography as well as UV micro/nano imprint lithography.

Although an embodiment of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for fabricating a stamp for micro/nano imprint lithography comprising:
    depositing a thin film of diamond-like carbon on a substrate;
    applying resist on the diamond-like carbon thin film;
    patterning the resist;
    etching the diamond-like carbon thin film by using the resist as a protective layer; and
    removing the resist,
    wherein a solid target containing a fluoro group (F) is sputtered in depositing the diamond-like carbon thin film such that the diamond-like carbon thin film contains a fluoro group (F).

2. The method for fabricating a stamp for micro/nano imprint lithography of claim 1, wherein the deposition in depositing the diamond-like carbon thin film is carried out by a process selected from ion plating, plasma chemical vapor deposition (CVD) using direct current (DC) or radio frequency (RF), sputtering using DC, RF or ion-beam, and laser synthesis.

3. The method for fabricating a stamp for micro/nano imprint lithography of claim 1, wherein the diamond-like carbon thin film is etched by plasma etching process including reactive ion etching (RIE).

4. The method for fabricating a stamp for micro/nano imprint lithography of claim 1, wherein fluorocarbon resins is used as a the solid target including a fluoro group (F).

5. The method for fabricating a stamp for micro/nano imprint lithography of claim 4, wherein the fluorocarbon resins is polytetrafluoroethylene (PTFE).

6. A method for fabricating a stamp for micro/nano imprint lithography comprising:
    depositing a first thin film of diamond-like carbon on a substrate;
    applying resist on the first diamond-like carbon thin film;
    patterning the resist;
    depositing a second diamond-like carbon thin film on top of the patterned resist and on the first diamond-like carbon thin film exposed through openings of the patterned resist; and
    removing the resist,
    wherein a solid target containing a fluoro group (F) is sputtered in depositing the first diamond-like carbon thin film or in depositing the second diamond-like carbon thin film such that the first diamond-like carbon thin film or the second diamond-like carbon thin film contains a fluoro group (F).

7. The method for fabricating a stamp for micro/nano imprint lithography of claim 6, wherein the diamond-like carbon thin film is etched by plasma etching process including reactive ion etching (RIE).

8. The method for fabricating a stamp for micro/nano imprint lithography of claim 6, wherein both of the resist and the second diamond-like carbon thin film deposited on the resist are removed together in the step to remove the resist.

9. A method for fabricating a stamp for micro/nano imprint lithography comprising:
    depositing a first thin film of diamond-like carbon on a substrate;
    forming micro/nano-structures on top of the first diamond-like carbon thin film; and
    depositing a second diamond-like carbon thin film to encompass the micro/ nano-structures,
    wherein a solid target containing a fluoro group (F) is sputtered in depositing the first diamond-like carbon thin film or in depositing the second diamond-like carbon thin film such that the first diamond-like carbon thin film or the second diamond-like carbon thin film contains a fluoro group (F).

10. The method for fabricating a stamp for micro/nano imprint lithography of claim 9, wherein the micro/nano-structures are made of a resin material.

* * * * *